United States Patent
Ikeda et al.

(10) Patent No.: US 8,421,232 B2
(45) Date of Patent: Apr. 16, 2013

(54) SEMICONDUCTOR DEVICE AND AUTOMOTIVE AC GENERATOR

(75) Inventors: Osamu Ikeda, Yokohama (JP); Masato Nakamura, Fujisawa (JP); Satoshi Matsuyoshi, Takahagi (JP); Koji Sasaki, Tsuchiura (JP); Shinji Hiramitsu, Kashiwa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/117,544

(22) Filed: May 27, 2011

(65) Prior Publication Data

US 2011/0223718 A1  Sep. 15, 2011

Related U.S. Application Data

(60) Continuation of application No. 12/232,676, filed on Sep. 22, 2008, now Pat. No. 7,964,492, which is a division of application No. 11/471,476, filed on Jun. 21, 2006, now abandoned.

(30) Foreign Application Priority Data

Aug. 31, 2005  (JP) .................................. 2005-251090

(51) Int. Cl.
*H01L 23/48* (2006.01)
*H01L 23/52* (2006.01)

(52) U.S. Cl.
USPC .................... 257/772; 257/783; 257/E23.023

(58) Field of Classification Search .................. 257/772, 257/783, E23.023
See application file for complete search history.

(56) References Cited

U.S. PATENT DOCUMENTS

| 5,527,628 | A | 6/1996 | Anderson et al. |
| 5,798,566 | A | 8/1998 | Sato et al. |
| 5,863,493 | A | 1/1999 | Achari et al. |
| 6,190,947 | B1 | 2/2001 | Tai et al. |
| 6,867,503 | B2 * | 3/2005 | Zeng .............................. 257/779 |
| 6,879,041 | B2 | 4/2005 | Yamamoto et al. |
| 6,969,915 | B2 * | 11/2005 | Tago et al. .................... 257/781 |
| 2002/0140059 | A1 * | 10/2002 | Yamazaki et al. ............ 257/658 |
| 2003/0132271 | A1 | 7/2003 | Kao et al. |
| 2003/0156969 | A1 | 8/2003 | Choi et al. |
| 2003/0175146 | A1 | 9/2003 | Yeh et al. |
| 2004/0135244 | A1 | 7/2004 | Yamazaki et al. |
| 2004/0222532 | A1 * | 11/2004 | Zeng .............................. 257/772 |
| 2005/0040518 | A1 | 2/2005 | Brandenburg et al. |
| 2005/0106059 | A1 | 5/2005 | Farooq et al. |

(Continued)

FOREIGN PATENT DOCUMENTS

| JP | 52-147065 | 12/1977 |
| JP | 61-177754 A | 9/1986 |

(Continued)

*Primary Examiner* — Nitin Parekh
(74) *Attorney, Agent, or Firm* — Antonelli, Terry, Stout & Kraus, LLP.

(57) ABSTRACT

A semiconductor device includes a semiconductor element, a support member bonded to a first surface of the semiconductor element with a first bonding material and a lead electrode bonded to a second surface of the semiconductor element supported on the support member with a second bonding material, and further including a method of producing the semiconductor device. Respective connecting parts of the support member and the lead electrode are Ni-plated and each of the first and the second bonding material is a Sn solder having a $Cu_6Sn_5$ content greater than a eutectic content.

6 Claims, 9 Drawing Sheets

U.S. PATENT DOCUMENTS

| | | |
|---|---|---|
| 2005/0218525 A1* | 10/2005 | Takahashi et al. ............ 257/772 |
| 2005/0275096 A1 | 12/2005 | Zeng et al. |
| 2006/0061974 A1 | 3/2006 | Soga et al. |
| 2006/0081995 A1* | 4/2006 | Takahashi et al. ............ 257/772 |
| 2007/0074790 A1 | 4/2007 | Yamakoshi et al. |

FOREIGN PATENT DOCUMENTS

| | | |
|---|---|---|
| JP | 03-230509 A | 10/1991 |
| JP | 07-221235 | 8/1995 |
| JP | 09-232340 | 9/1997 |
| JP | 10-118783 | 5/1998 |
| JP | 11-245083 | 9/1999 |
| JP | 11-3152945 | 1/2001 |
| JP | 2002-203925 | 7/2002 |
| JP | 2002-222708 | 8/2002 |
| JP | 2002-280417 | 9/2002 |
| JP | 2002-305213 | 10/2002 |
| JP | 2003-309223 A | 10/2003 |
| JP | 2005-184976 A | 7/2005 |
| JP | 2005-252029 A | 9/2005 |
| JP | 2005-252030 A | 9/2005 |
| WO | WO 2005/020322 | 3/2005 |
| WO | WO 2005-041290 | 6/2005 |

* cited by examiner

SEMICONDUCTOR DEVICE AND AUTOMOTIVE AC GENERATOR

This is a continuation application of U.S. application Ser. No. 12/232,676, filed Sep. 22, 2008 now U.S. Pat. No. 7,964,492, which, in turn, is a divisional application of U.S. application Ser. No. 11/471,476, filed Jun. 21, 2006 now abandoned, and the entire disclosures of which are hereby incorporated by reference.

BACKGROUND OF THE INVENTION

1. Field of the Invention

The present invention relates to a semiconductor device fabricated by using a solder capable of maintaining a reliable bonding ability at high temperatures and an automotive ac generator (alternator) provided with the semiconductor device.

2. Description of the Related Art

As mentioned in JP-A 07-221235 (Patent document 1) by way of example, a semiconductor device for an automotive ac generator is constructed so as to reduce thermal stress that is induced therein due to difference in thermal expansion between the semiconductor device and electrodes so that the semiconductor device can withstand a severe thermal cycle. Since the automotive ac generator is installed near an engine, the semiconductor device included in the automotive ac generator is required to withstand a high temperature of 200° C. Therefore, the electrodes of the semiconductor device are soldered to circuit terminals with, for example, a high-Pb solder having a solidus around 300° C., such as a Pb—Sn alloy containing 95% by weight Pb and 5% by weight Sn and having a solidus of 300° C. and a liquidus of 314° C.

From a viewpoint of environmental protection, there is a demand for semiconductor devices using a bonding material not containing Pb which imparts a heavy load to the environment. An Au-20Sn solder (eutectic, 280° C.), an Au-12Ge solder (eutectic, 356° C.) and an Au-15S solder (eutectic, 363° C.) are Pb-free solders not containing Pb and having properties similar to those of high-Pb solders. However, those Au solders, namely, Pb-free solders, are very expensive. The Au-20Sn solder having a comparatively low Au content is a hard solder incapable of satisfactorily relaxing stress induced in a wire area and hence a semiconductor device having electrodes bonded to terminals by this hard solder is likely to break.

A Sn solder, such as a Sn-3Ag-0.5Cu solder having a melting point not lower than 200° C., is another Pb-free solder having a medium melting point. This Sn solder is used prevalently for mounting parts to a wiring board and has satisfactory bond reliability at temperatures not higher than 150° C. However, if parts soldered by this Sn solder are kept for a long time in a working environment of 200° C. or above, an interfacial reaction occurs in the interface between the bonded parts. Consequently, voids are formed and intermetallic compounds grow and the bond reliability is reduced.

A method of suppressing the interfacial reaction of the Sn solder disclosed in Jpn. Pat. No. 3152945 (Patent document 2) uses a Sn solder containing 0.1 to 2% by weight Cu, 0.002 to 1% by weight Ni and Sn as the remainder. It is mentioned in Patent document 2 that Cu contained in this Sn solder controls the Cu erosion of the materials of bonded parts and Ni contained in this Sn solder controls the growth of intermetallic compounds, such as $Cu_6Sn_5$ and $Cu_3Sn$ in interface between bonded parts. A method of forming a solder bump mentioned in JP-A 2002-280417 (Patent document 3) forms two kinds of metal layers that interact with a Sn solder and form intermetallic compounds on the surface of a part to be bonded to another part and bonds a Sn solder ball to the surface. It is mentioned in Patent document 3 that an interfacial reaction can be suppressed by thus forming a thin layer of an intermetallic compound containing two or three elements including Sn in the interface between the bonded parts.

SUMMARY OF THE INVENTION

Those known techniques have the following problems, are not satisfactory in suppressing an interfacial reaction and have low bond reliability. It is known that those known techniques are unable to suppress interface reaction in the semiconductor device included in an automotive ac generator (alternator) which is used in a high-temperature environment.

The method disclosed in Patent document 2 using the Sn solder containing Ni is expected to suppress an interfacial reaction to some extent. However, an interfacial reaction occurs at high temperatures not lower than 200° C. because $Cu_6Sn_5$ and $Cu_3Sn$ are always in contact with the Cu and the Sn solder. Consequently, grains of a Cu—Sn compound grow continuously, voids are formed in the interface and the bond reliability is reduced.

The method of forming a solder bump disclosed in Patent document 3 is expected to have a high interfacial reaction suppressing effect because the intermetallic compound layer nearest to the solder bump serves as a barrier layer between the Sn solder and the metal layer and exercises a high interfacial reaction suppressing effect. However, two metal layers, namely, a first metal layer and a second metal layer, need to be formed previously on a part to be bonded. Therefore, an additional plating process for selective local plating is necessary, which increases the cost. It is difficult in some cases to form the metal layer when electrodes cannot be formed. The metal layer formed on the bonding surface needs to react with the Sn solder when the metal layer is bonded to the Sn solder to form the barrier layer. If the metal layer is thick, an unreacted part remains in the surface metal layer and the effect of the barrier layer is unsatisfactory. Thus it is possible that the process needs to be adjusted to extend bonding time to make the metal layer react completely. If the surface metal layer is thin, the barrier layer for suppressing an interfacial reaction is thin and the thin barrier layer possibly cannot satisfactorily suppress an interfacial reaction at high temperatures not lower than 200° C. As shown in FIG. 2, exposed unreacted parts of the metal layer 15, such as a Cu layer, remaining after interaction between the Sn solder and the metal layer 15, oxidation and corrosion starts from the exposed unreacted parts of the metal layer 15. As shown in FIG. 3, if a bonding surface outermost layer is formed locally by local plating to prevent the survival of the bonding surface outermost layer, the Sn solder possibly spreads and wet a metal layer 11, such as a Ni layer, underlying the bonding surface outermost layer. Consequently, an intermetallic compound 16, such as a Ni—Sn compound is formed, an interfacial reaction occurs in this part and voids are likely to be formed due to volume change.

Accordingly, it is an object of the present invention to provide a semiconductor device fabricated by using a low-cost bonding material for bonding a semiconductor device to a circuit, imparting low load to the environment and capable of maintaining bond reliability for a long time of use at high temperatures not lower than 200° C. Another object of the present invention is to provide an automotive ac generator provided with the semiconductor device.

A semiconductor device according to a first aspect of the present invention includes: a semiconductor element; a support member bonded to a first surface of the semiconductor element with a first bonding material; and a lead electrode bonded to a second surface of the semiconductor element supported on the support member with a second bonding material; wherein respective connecting parts of the support member and the lead electrode are Ni-plated, each of the first and the second bonding material is a Sn solder having a $Cu_6Sn_5$ content greater than a eutectic content.

A semiconductor device according to a second aspect of the present invention includes: a semiconductor element; a support member bonded to a first surface of the semiconductor element with a first bonding material; and a lead electrode bonded to a second surface of the semiconductor element supported on the support member with a second bonding material; wherein respective connecting parts of the support member and the lead electrode are Ni-plated, each of the first and the second bonding material is a Sn solder containing $Cu_6Sn_5$ in a temperature range between a room temperature and 200° C.

A semiconductor device according to a third aspect of the present invention includes: a semiconductor element; a support member bonded to a first surface of the semiconductor element with a first bonding material; and a lead electrode bonded to a second surface of the semiconductor element supported on the support members with a second bonding material; wherein a plated Ni layer and a Cu—Sn compound layer are formed in each of an interface between the support member and the first bonding material and an interface between the first bonding material and the semiconductor element, and a plated Ni layer and a Cu—Sn compound layer are formed in each of an interface between the lead electrode and the second bonding material and an interface between the second bonding material and the semiconductor element.

An automotive ac generator according to the aspects of the present invention is provided with any one of the foregoing semiconductor devices.

The aspects of the present invention provides a semiconductor device that imparts a low load to the environment and capable of withstanding high temperatures not lower than 200° C.

BRIEF DESCRIPTION OF THE DRAWINGS

FIG. 16 is a typical view of a semiconductor device in an embodiment according to the present invention; and.

DESCRIPTION OF THE PREFERRED EMBODIMENTS

Figure 4:
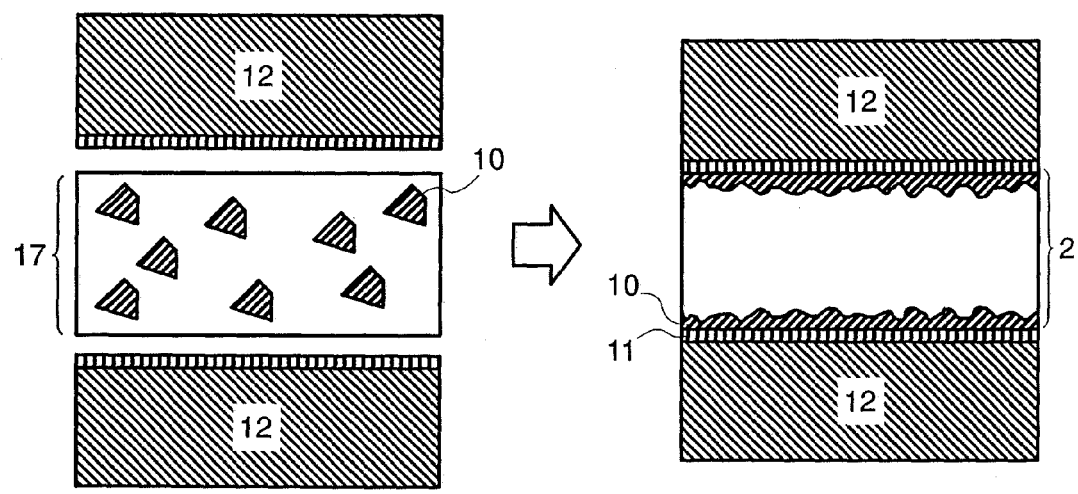
FIG. 4 is a typical sectional view of a bonding mechanism according to the present invention.

A bonding material and a bonding mechanism applied to a semiconductor device in a preferred embodiment according to the present invention will be described with reference to FIG. 4.

A bonding material to be used for fabricating the semiconductor device according to the present invention is a Sn solder foil 17 made of a Sn solder containing Cu—Sn compound grains 10, such as $Cu_6Sn_5$ grains 10, at temperatures between a room temperature and 200° C. When parts 12 each having a surface coated with a Ni layer 11 formed by plating are bonded by the Sn solder foil 17, the $Cu_6Sn_5$ grains 10 contained in the Sn solder foil 17 deposit on or migrate to the plated Ni layers 11 and compound layers 10 containing a Cu—Sn compound as a principal component are formed. The compound layer 10 each formed between the plated Ni layer and the Sn solder serve as barrier layers. The barrier layers suppress the growth of compound layers resulting from an interfacial reaction and the formation of voids resulting from the growth of compound layers at high temperatures not lower than 200° C.

Figure 1:
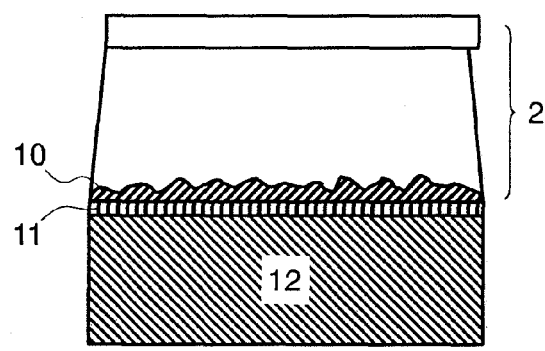
FIG. 1 is a typical sectional view of a bonded structure according to the present invention.
Figure 2:
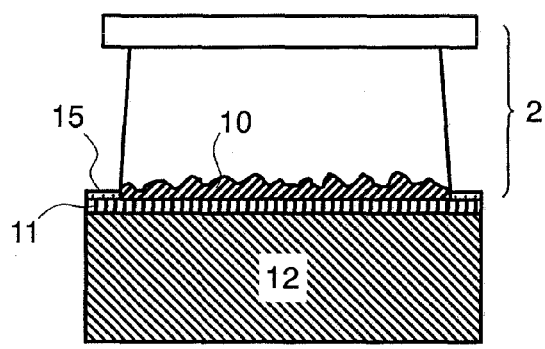
FIG. 2 is a typical sectional view of a possible bonded structure mentioned in Patent document 3.
Figure 3:
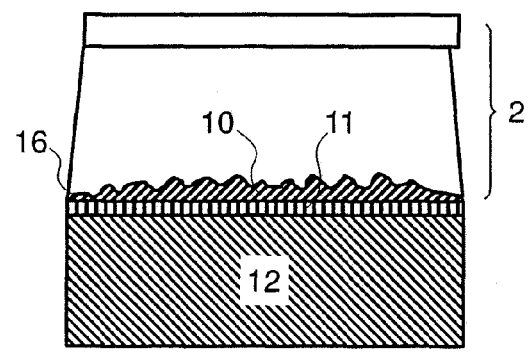
FIG. 3 is a typical sectional view of a possible bonded structure mentioned in Patent document 3.

A bonding mechanism applied to the semiconductor device according to the present invention includes at least one plated layer of Ni, Ni—P or Ni—B formed on a member to be bonded. Therefore, bonding can be achieved by a small number of steps. The thickness of the barrier layer included in the bonding mechanism according to the present invention is dependent on the Cu—Sn compound content of the Sn solder foil. Therefore, the thickness of the barrier layer can be adjusted by adjusting the Cu—Sn compound content of the Sn solder foil. As shown in FIG. 1, the Cu—Sn compound grains 10 contained in the Sn solder deposit on or migrate to the plated Ni layer 11 actively in the interface wetted with the Sn solder and form a barrier layer of the Cu—Sn compound. Therefore, the foregoing problems shown in FIGS. 2 and 3 do not arise in the joint.

Figure 14:
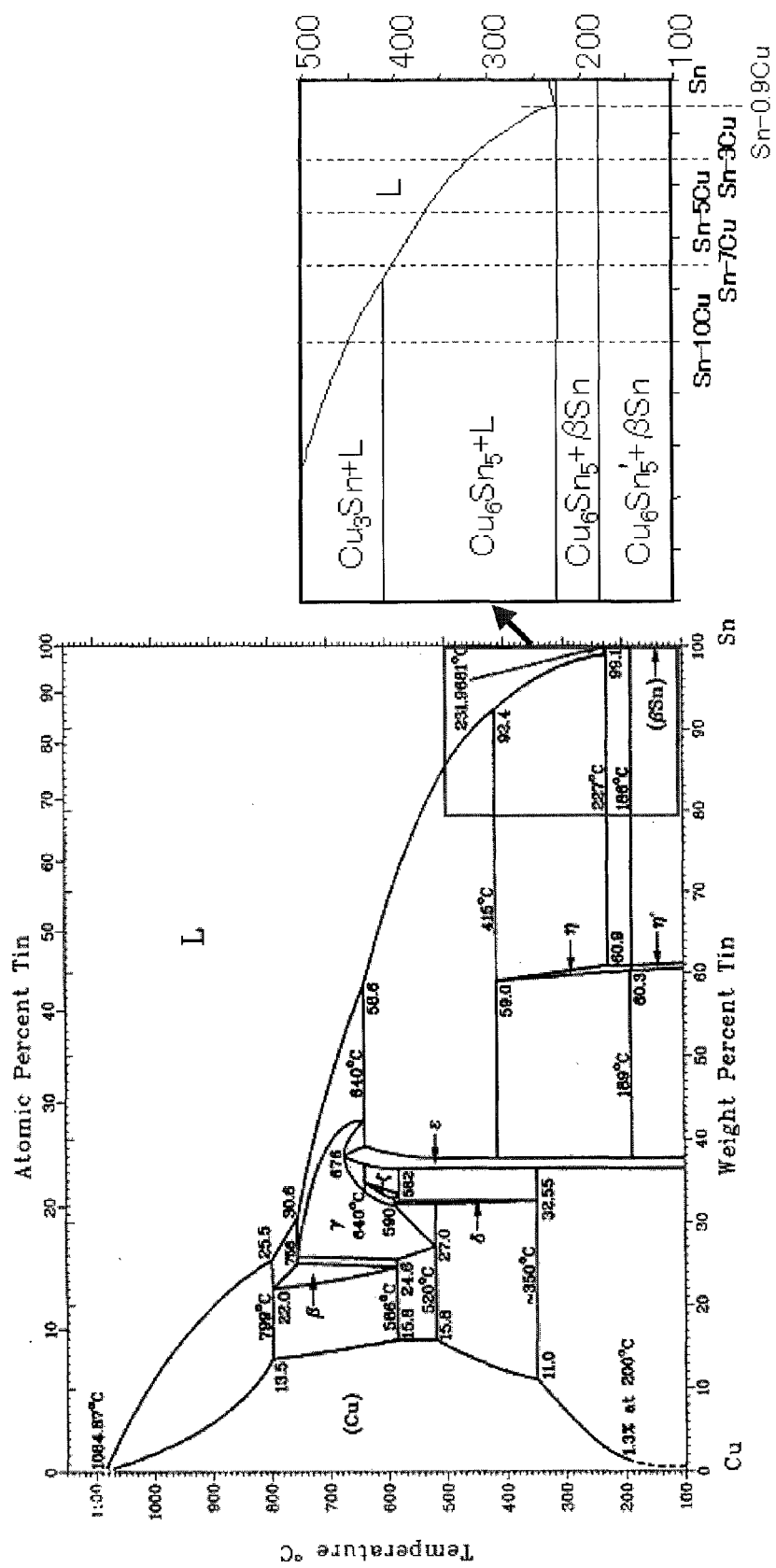
FIG. 14 is a phase diagram of a Cu—Sn alloy.

Conditions that the bonding material contains Cu—Sn compound grains and the bonding material is a Sn solder containing $Cu_6Sn_5$ at temperatures between a room temperature and 200° C. will be described with reference to a phase diagram shown in FIG. 14.

When a molten solder of a composition having a Cu content smaller than Sn-0.9Cu solidifies, Sn contained in the solder in a Sn content greater than a eutectic content deposit in primary crystals in an initial stage of solidification, and eutectic grains of Sn and $Cu_6Sn_5$ solidify in a final stage of solidification. When the solder solidifies, $Cu_6Sn_5$ grains are dispersed in grain boundaries in the joint and do not form a barrier layer on the plated Ni layer. Therefore, heat resistance is unsatisfactory. When a molten solder of a composition having a Cu content greater than Sn-0.9Cu solidifies, $Cu_6Sn_5$ deposits first. Since $Cu_6Sn_5$ deposits preferentially on the plated Ni layer and a barrier layer of a Cu—Sn compound is formed. A eutectic of Sn and $Cu_6Sn_5$ solidifies in a final stage of solidification. Thus the barrier layer of the Cu—Sn compound is formed.

The desirable bonding material for fabricating the semiconductor device according to the present invention has a composition having a $Cu_6Sn_5$ content greater than a eutectic content. A desirable Cu content of a Sn—Cu two-element bonding material is 0.9% by weight or above. Alloys containing elements in addition to Cu and Sn have different eutectic compositions, respectively. Therefore, a desirable bonding material has a $Cu_6Sn_5$ content greater than a eutectic content. Each of a Sn-3Ag-0.5Cu material and a Sn-0.7Cu material, which are generally used, having a $Cu_6Sn_5$ content smaller than a eutectic content does not form a barrier layer on the plated Ni layer.

Figure 6:
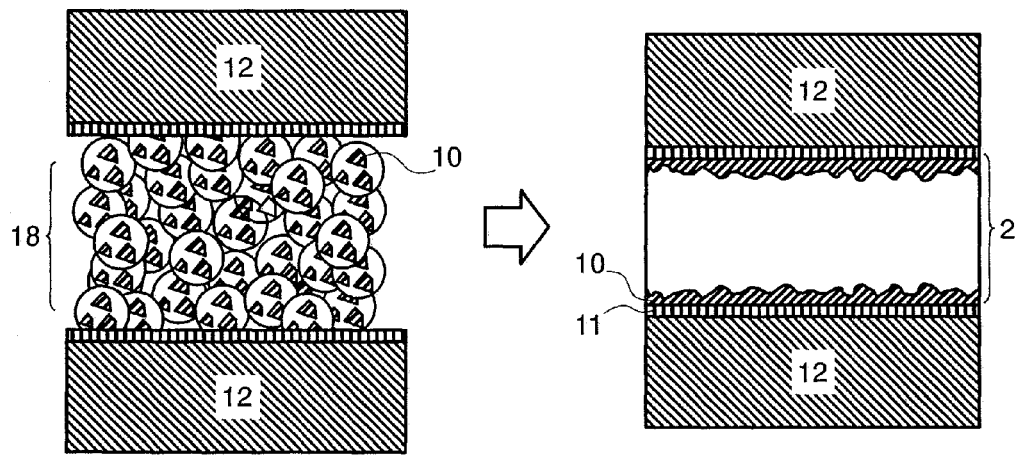
FIG. 6 is a typical sectional view of a bonding mechanism according to an embodiment of the present invention.
Figure 7:
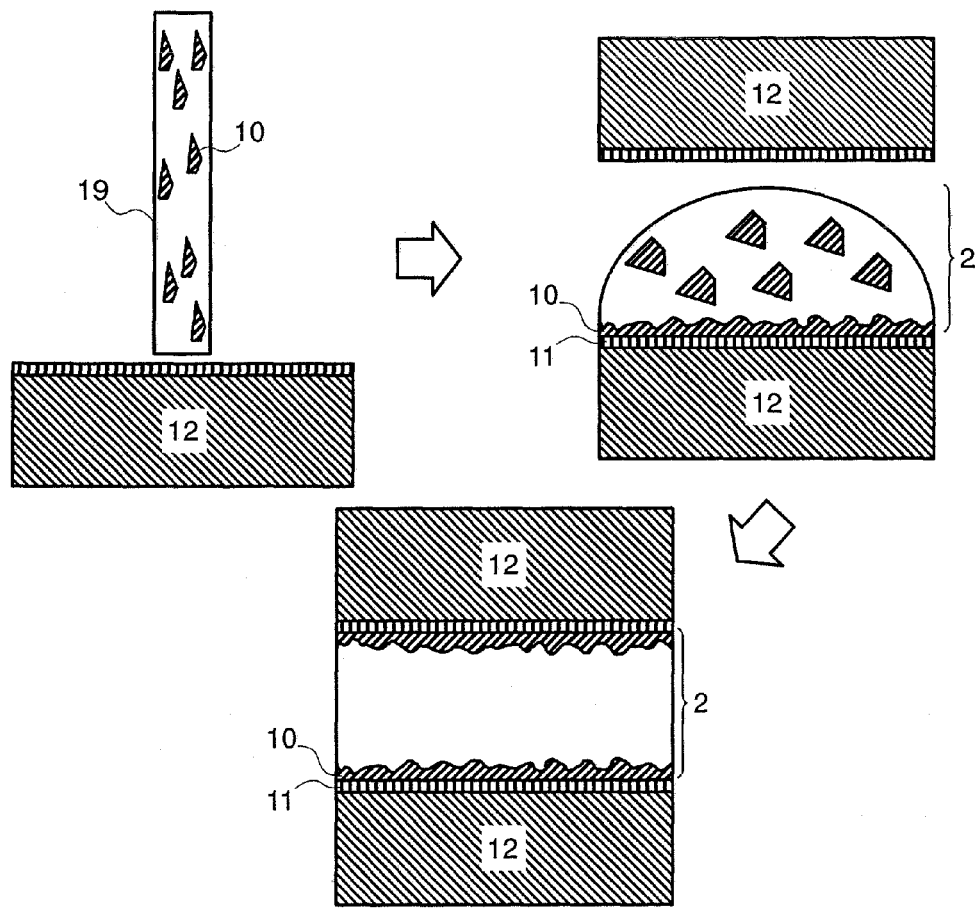
FIG. 7 is a typical sectional view of a bonding mechanism according to an embodiment of the present invention.

The bonding material does not need to be supplied in a foil and may be supplied in a paste as shown in FIG. 6 or in a wire as shown in FIG. 7. Either of the paste of the bonding material and the wire of the bonding material forms a barrier layer of a Cu—Sn compound on the plated Ni layer. The bonding material may be supplied by a supplying method suitable for the bonding environment.

It is preferable for satisfactory wettability that the Sn solder containing $Cu_6Sn_5$ at temperatures between a room temperature and 200° C. has a composition having a liquidus of a temperature not higher than a bonding temperature.

The semiconductor device in the preferred embodiment for an automotive ac generator and a method of fabricating the same using the bonding material meeting the requirements of the present invention will be described with reference to FIGS. 8 and 9.

Figure 8:
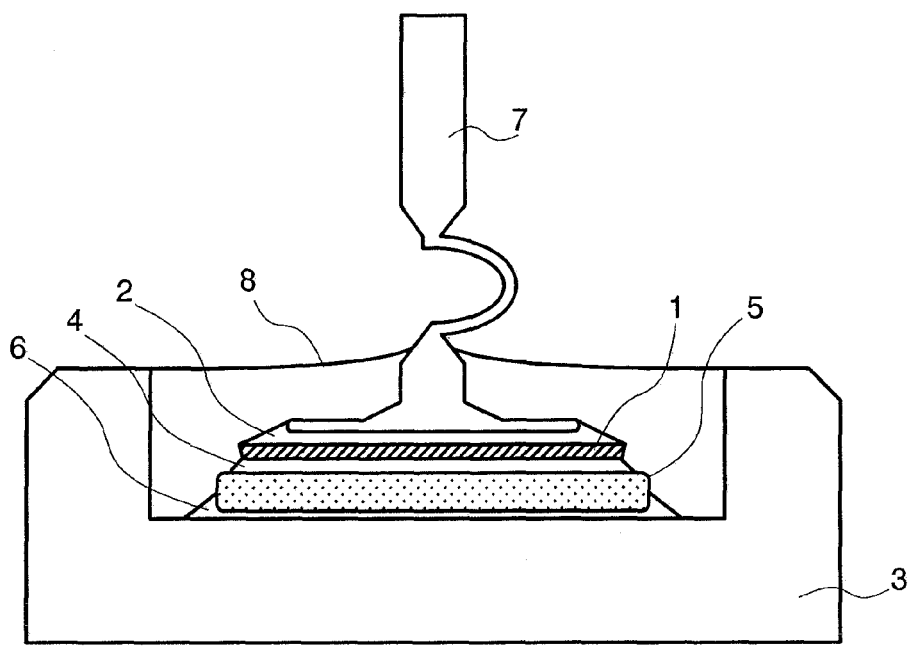
FIG. 8 is a typical sectional view of a semiconductor device in an embodiment according to the present invention.

Referring to FIG. 8, the semiconductor device includes a semiconductor element 1, a lead electrode 7 having a Ni-plated connecting part bonded to a first surface of the semiconductor element 1 by a bonding layer 2 of the bonding material of the present invention, a buffer member 5, for absorbing stress resulting from thermal expansion difference, having a Ni-plated connecting part and bonded to a second surface of the semiconductor element 1 by a bonding layer 4 of the bonding material of the present invention, and a support member 3 bonded to the buffer member 5 by a bonding layer 6 of the bonding material of the present invention.

Since the components of the semiconductor device are bonded with the bonding material meeting the requirements of the present invention, an interfacial reaction in the semiconductor device can be suppressed and the semiconductor device has bond reliability when the semiconductor device is used in a high-temperature environment. Although all the bonding layers do not necessarily need to be made of the bonding material meeting the requirements of the present invention and some of the bonding layers may be made of a bonding material other than the bonding material meeting the requirements of the present invention, it is preferable that all the bonding layers are made of the bonding material meeting the requirements of the present invention from the view point of ensuring bond reliability. The bonding material may be of any composition, provided that the $Cu_6Sn_5$ content is greater than the eutectic content. The bonding layers may be made of different materials, respectively.

Figure 5:
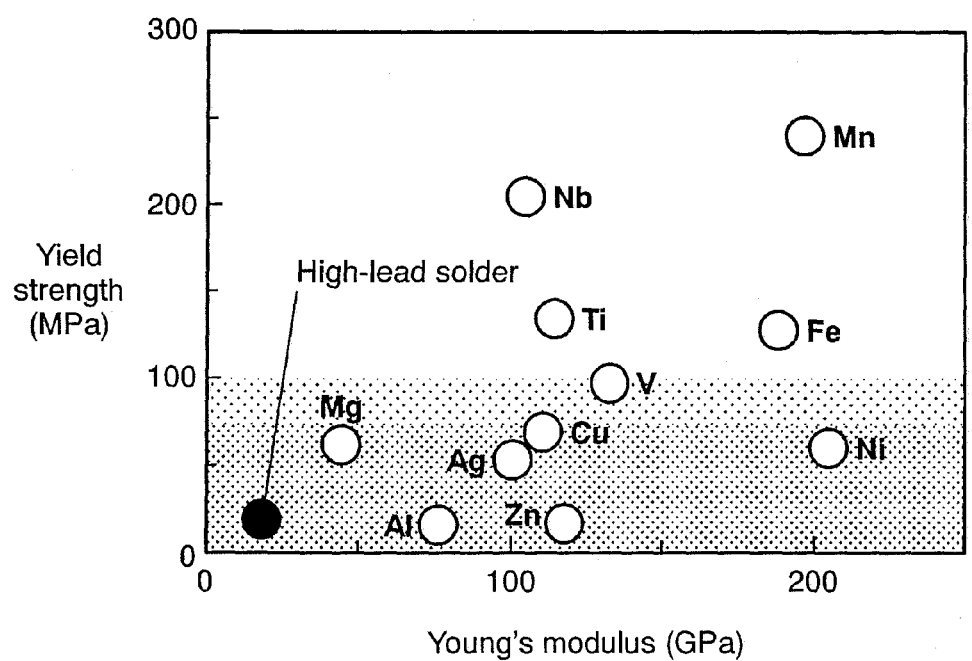
FIG. 5 is diagram showing the Young's moduli and yield strengths of possible buffering materials.

The buffer member 5 may be made of any one of Al, Mg, Ag, Zn, Cu and Ni. Each of those metals has a low yield strength and members made of those metals are easily deformable. The buffer member 5 absorbs a stress induced in the bonded parts due to difference in thermal expansion between the bonded parts when the bonded parts are cooled and are subjected to a thermal cycle test. As shown in FIG. 5, it is desirable that the yield strength is 75 MPa or below. If the yield strength is 100 MPa or above, the buffering effect of the buffer member 5 is insufficient and, in some cases, the semiconductor element 1 cracks. Preferably, the buffer member 5 has a thickness between 30 and 500 µm. If the thickness of the buffer member 5 is below 30 µm, the buffer member 5 is unable to absorb stress sufficiently and, in some cases, the semiconductor element 1 and the intermetallic compound layers crack. If the thickness of the buffer member 5 is greater than 500 µm, the buffer member 5 the effect of the thermal expansion of the buffer member 5 exceeds the buffering effect of the buffer member 5 because Al, Mg, Ag and Zn have coefficients of thermal expansion greater than the Cu electrode, and the buffer member 5 having such a big thickness reduces reliability.

The buffer member 5 may be made of a Cu/Invar/Cu composite material, a Cu/Cu20 composite material, a Cu—Mo alloy, Ti, Mo or W. The buffer member 5 can absorb stress induced in the bonding layer due to difference in coefficient of thermal expansion between the semiconductor element and the Cu electrode when the semiconductor device is subjected to thermal cycles and when the semiconductor device is cooled after the bonding processes. If the buffer member 5 is excessively thin, the buffer member 5 cannot satisfactorily absorb stress and, in some cases, the semiconductor element and the intermetallic compound layers crack. Preferably, the thickness of the buffer member 5 is 30 µm or above.

The Sn solder has a thermal conductivity higher than those of high-lead solders. Therefore, the use of the Sn solder is effective in reducing the resistance of the semiconductor device and heat radiation from the semiconductor device. Although the buffer member 5 may be omitted as shown in FIG. 9, it is preferable that the semiconductor device is provided with the buffer member 5 for satisfactory bond reliability even if the Sn solder harder than the high-lead solder is used.

The Ni layers formed by plating on the parts may be Ni layers, Ni—P layers or Ni—B layers. The Ni layers may be coated with coated with an Au layer or an Ag layer to improve solder-wettability. The Au layer or the Ag layer can be diffused entirely in the solder during bonding and hence the Cu—Sn compound barrier can be formed on the Ni layer.

A method of fabricating the semiconductor device shown in FIG. 8 will be described. The Sn solder foil containing $Cu_6Sn_5$ at temperatures between a room temperature and 200° C., namely, a bonding member 6, the Ni-plated buffer member 5 of 6.8 mm in diameter and 0.6 mm in thickness, made of a cladding material (Cu/Invar/Cu) having a coefficient of thermal expansion of $11 \times 10^{-6}/°$ C., the Sn solder foil 4 containing $Cu_6Sn_5$ at temperatures between a room temperature and 200° C., the Ni-plated semiconductor element 1 of 6 mm in diameter and 0.2 mm in thickness, the Sn solder foil 2 containing $Cu_6Sn_5$ at temperatures between a room temperature and 200° C., and the lead electrode 7 having a Cu plate of 4.5 mm in diameter and 0.2 mm in thickness are stacked up in that order on the support member 3 to form a layered structure. The layered structure is subjected to a bonding process to heat the layered structure at 380° C. for 1 min in a reducing nitrogen atmosphere containing 50% hydrogen to bond the adjacent components by the Sn solder. Then, silicone rubber 8 is poured into a space in the support member 3 and the silicone rubber is cured to complete the semiconductor device. When the bonding process is heats the layered structure at a temperature between 220° C. and 450° C. in a reducing atmosphere, the adjacent components can be satisfactorily bonded together without using any flux.

Semiconductor devices in Examples 1 to 12 thus fabricated and those in Comparative examples 1 to 5 were subjected to a thermal cycle test and a high-temperature endurance test, and bond strengths holding the adjacent component parts of the semiconductor devices were measured after those tests. Measured data is shown in Table 1.

TABLE 1

Figure 9:
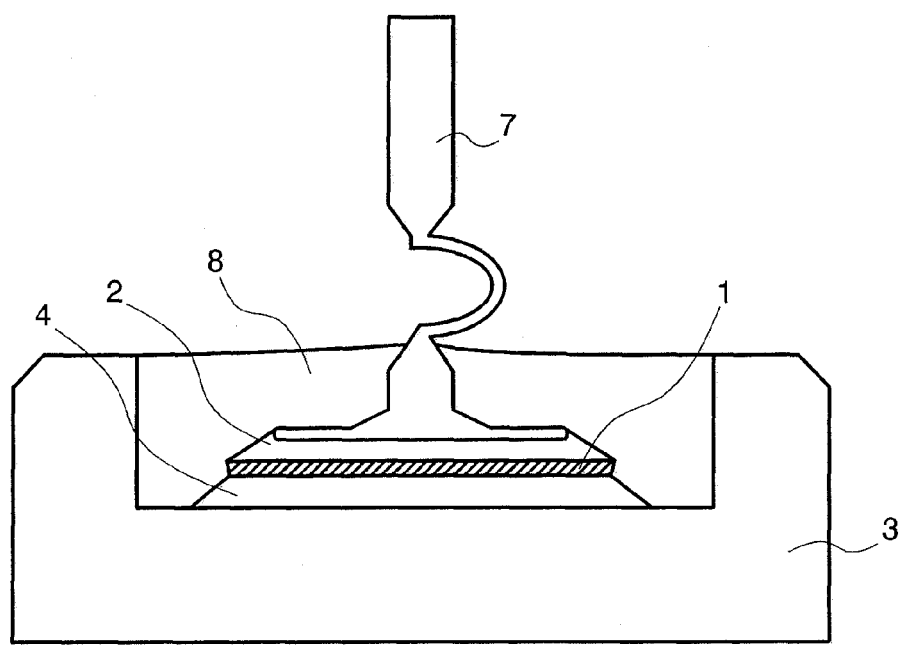
FIG. 9 is a typical sectional view of a semiconductor device according to the present invention.

|   | Composition of the solder (percent by mass) | Bonded member | Construction | Thermal cycle test (500 cycles) | High-temperature endurance test (1000 h) |
|---|---|---|---|---|---|
| Examples | | | | | |
| 1 | Sn—3Cu | Ni plated | FIG. 8 | ○ | ○ |
| 2 | Sn—5Cu | Ni plated | FIG. 8 | ○ | ○ |
| 3 | Sn—7Cu | Ni plated | FIG. 8 | ○ | ○ |
| 4 | Sn—3Ag—3Cu | Ni plated | FIG. 8 | ○ | ○ |
| 5 | Sn—3Ag—5Cu | Ni plated | FIG. 8 | ○ | ○ |
| 6 | Sn—5Cu | Ni—P plated | FIG. 8 | ○ | ○ |
| 7 | Sn—3Cu | Ni plated | FIG. 9 | ○ | ○ |
| 8 | Sn—5Cu | Ni plated | FIG. 9 | ○ | ○ |
| 9 | Sn—7Cu | Ni plated | FIG. 9 | ○ | ○ |
| 10 | Sn—3Ag—3Cu | Ni plated | FIG. 9 | ○ | ○ |
| 11 | Sn—3Ag—5Cu | Ni plated | FIG. 9 | ○ | ○ |
| 12 | Sn—5Cu | Ni—P plated | FIG. 9 | ○ | ○ |
| Comparative examples | | | | | |
| 1 | Sn—2Ag | Ni plated | FIG. 8 | ○ | X |
| 2 | Sn—3Ag—0.5Cu | Ni plated | FIG. 8 | ○ | X |
| 3 | Sn—2Ag | Cu | FIG. 8 | X | X |
| 4 | Sn—3Ag—0.5Cu | Cu | FIG. 8 | X | X |
| 5 | Pb—10Sn | Ni plated | FIG. 8 | ○ | ○ |

Figure 12:
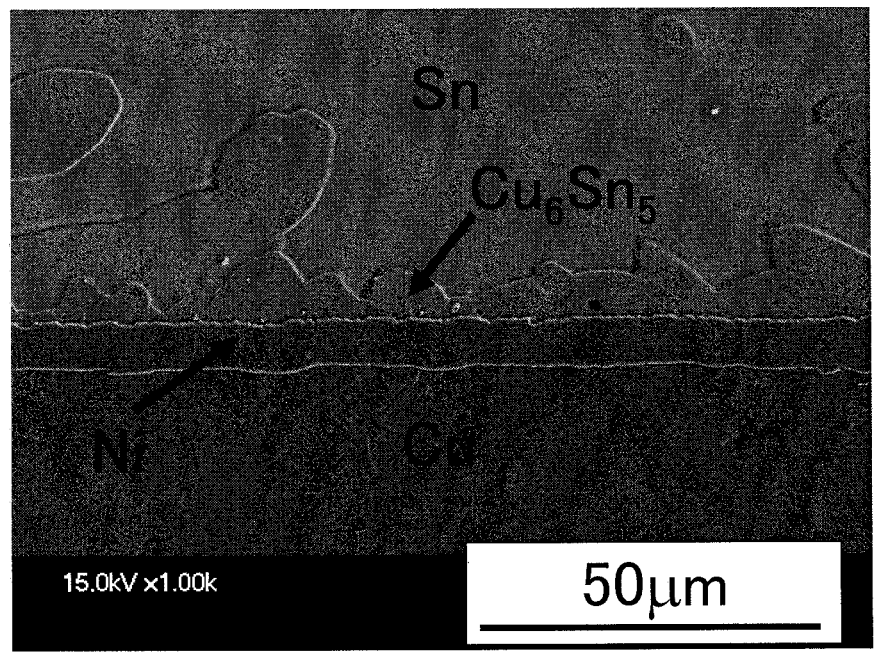
FIG. 12 is an SEM microphotograph of a section of a part of a bonded structure around the interface between the bonded surfaces after a high-temperature endurance test.

In Table 1, circles indicate the semiconductor devices in which bond strength after the test was not lower than 80% of an initial bond strength and crosses indicate the semiconductor devices in which bond strength after the test was below 80% of an initial bond strength. The thermal cycle included the steps of cooling at −40° C. for 30 min and heating at 200° C. for 30 min. The thermal cycle was repeated 500 times for the thermal cycle test. The high-temperature endurance test kept the semiconductor devices at 210° C. for 1000 h. Bond strengths after the high-temperature endurance test in the semiconductor devices in Examples 1 to 6 were not lower than 80% of the bond strengths before the high-temperature endurance test. Changes in thermal resistances of the semiconductor devices in Examples 1 to 6 caused by the test were not greater than 10%. FIG. 12 shows a section of a test piece formed by bonding parts with a Sn-5Cu solder and kept at 210° C. for 100 h. As obvious from FIG. 12, a barrier layer of a Cu—Sn compound prevented the loss of an Ni layer due to heating at a high temperature and any voids due to volume change were not formed.

Although the construction of the semiconductor device and the bonding process of simultaneously bonding the component parts with the Sn solder containing $Cu_6Sn_5$ at temperatures between a room temperature and 200° C., the component parts may be sequentially bonded together. For example, the buffer member 5, the semiconductor element 1 and the lead electrode 7 provided with the Cu plate may be bonded together with the Sn solder containing $Cu_6Sn_5$ at temperatures between a room temperature and 200° C. to form a subassembly, and then the subassembly may be bonded to the support member 3 with the Sn solder containing $Cu_6Sn_5$ at temperatures between a room temperature and 200° C.

Referring to FIG. 9, the Sn solder foil 4 containing $Cu_6Sn_5$ at temperatures between a room temperature and 200° C., namely, a bonding member, the Ni-plated semiconductor element 1 of 6 mm in diameter and 0.2 mm in thickness, the Sn solder foil 2 containing $Cu_6Sn_5$ at temperatures between a room temperature and 200° C., and the lead electrode 7 having a Cu plate of 4.5 mm in diameter and 0.2 mm in thickness are stacked up in that order on the support member 3 to form a layered structure. The layered structure is placed in a positioning jig. The layered structure is subjected to a bonding process to heat the layered structure at 450° C. for 5 min in a reducing nitrogen atmosphere containing 50% hydrogen to bond the adjacent components by the Sn solder. Then, silicone rubber 8 is poured into a space in the support member 3 and the silicone rubber is cured to complete the semiconductor device.

Semiconductor devices in Examples 1 to 12 thus fabricated and those in Comparative examples 7 to 12 were subjected to a thermal cycle test and a high-temperature endurance test, and bond strengths holding the adjacent component parts of the semiconductor devices were measured after those tests. Measured data is shown in Table 1. In Table 1, circles indicate the semiconductor devices in which bond strength after the test was not lower than 80% of an initial bond strength and crosses indicate the semiconductor devices in which bond strength after the test was below 80% of an initial bond strength. The thermal cycle included cooling at −40° C. for 30 min and heating at 200° C. for 30 min. The thermal cycle was repeated 500 times for the thermal cycle test. Bond strengths after the thermal cycle test in all the semiconductor devices in Examples 7 to 12 were not lower than 80% of the bond strengths before the thermal cycle test. Bond strengths after the high-temperature endurance test in all the semiconductor devices in Examples 7 to 12 were not lower than 80% of the bond strengths before the high-temperature endurance test. The high-temperature endurance test kept the semiconductor devices at 210° C. for 1000 h.

Description will be made of measured data on semiconductor devices in comparative examples fabricated by using a bonding material of a composition having a $Cu_6Sn_5$ content lower than a eutectic content.

Figure 10:
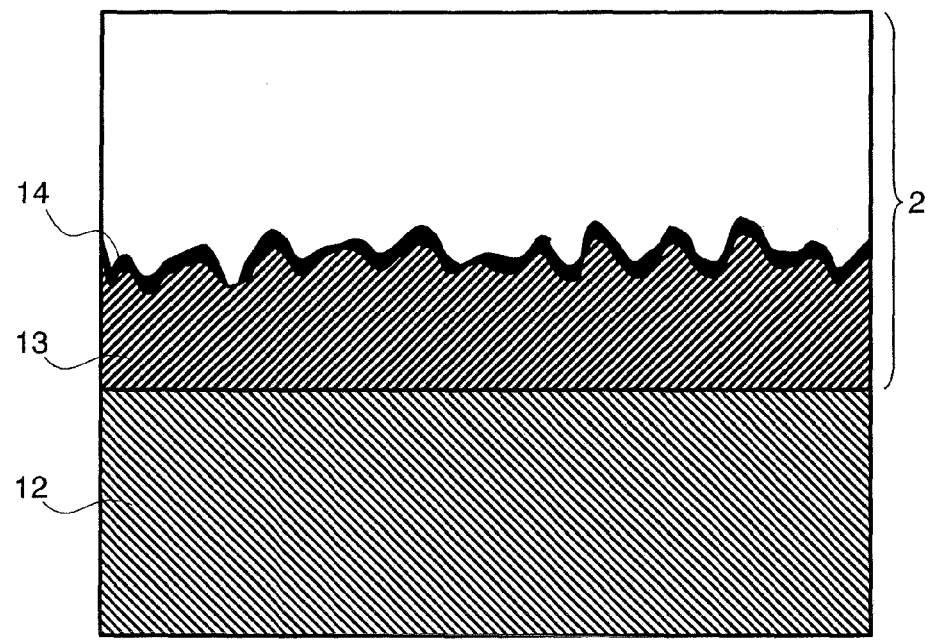
FIG. 10 is a typical view of voids formed in the interface between bonded surfaces.
Figure 11:
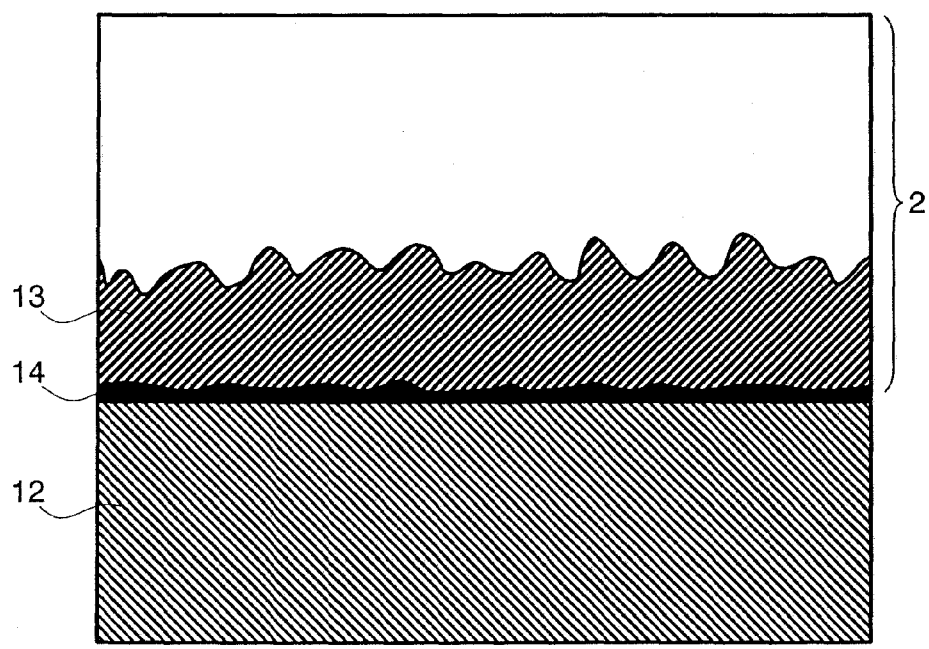
FIG. 11 is a typical view of voids formed in the interface between bonded surfaces.
Figure 13:
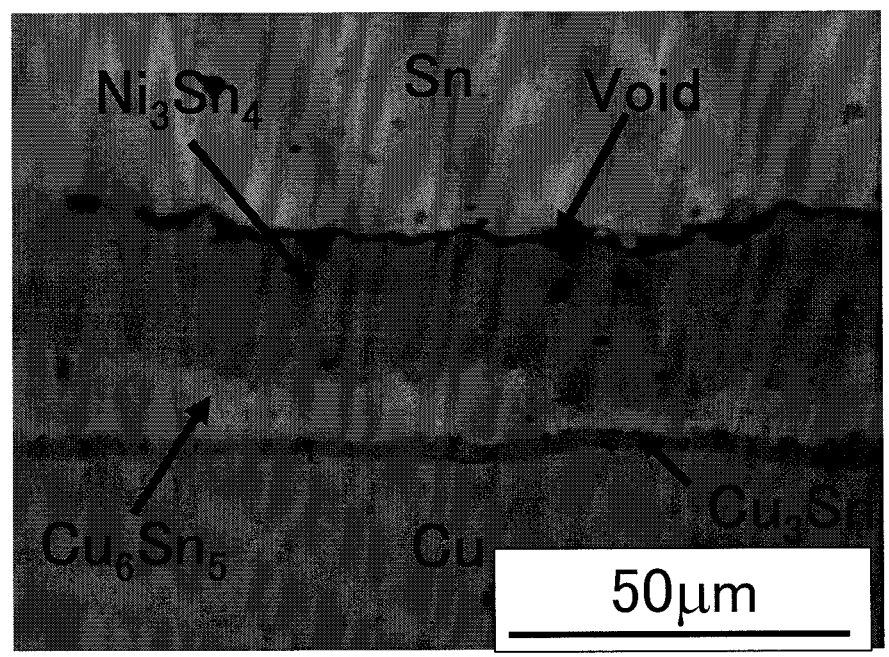
FIG. 13 is an SEM microphotograph of a section of a part of a bonded structure around the interface between the bonded surfaces after a high-temperature endurance test.

The semiconductor devices in Comparative examples 1 to 5 are the same in construction as the semiconductor devices in Examples 1 to 6. Measured data is shown in Table 1. In Table 1, circles indicate the semiconductor devices in which bond strength after the test was not lower than 80% of an initial bond strength and crosses indicate the semiconductor devices in which bond strength after the test was below 80% of an initial bond strength. The thermal cycle included the steps of cooling at −40° C. for 30 min and heating at 200° C. for 30 min. The thermal cycle was repeated 500 times for the thermal cycle test. The high-temperature endurance test kept the semiconductor devices at 210° C. for 1000 h. Bond strengths after the thermal cycle test in the semiconductor devices in Comparative examples 1 and 2 were not lower than 80% of the bond strengths before the thermal cycle test. Bond strengths after the high-temperature endurance test in all the semiconductor devices in Comparative examples 1 and 2 were below 80% of the bond strengths before the high-temperature endurance test. Voids 14 as shown in FIGS. 10 and 11 were formed in the interface between the bonded component parts. It is inferred that an interfacial reaction was promoted when the semiconductor device is kept at 210° C. for 1000 h, voids were formed due to volume change resulting from the growth of a compound layer and the voids reduced the bond strength. FIG. 13 shows a section of a structure formed by bonding parts with a Sn-3Ag-0.5Cu solder and heated at 210° C. for 1000 h. Since any barrier layer of a Cu—Sn compound is not formed, Sn and Ni interacted and a Ni layer disappeared completely and a Cu layer reacted with Sn and a thick Cu—Sn compound layer is formed. Voids formed due to a big volume change deteriorate the condition of bonding.

Bond strengths after the thermal cycle test, in which a thermal cycle including the steps of cooling at −40° C. for 30 min and heating at 200° C. for 30 min was repeated 500 times, in the semiconductor devices in Comparative examples 3 and 4 were below 80% of the bond strengths before the thermal cycle test. Bond strengths after the high-temperature endurance test in all the semiconductor devices in Comparative examples 3 and 4, similarly to those of the semiconductor devices in Comparative examples 1 and 2, were below 80% of the bond strengths before the high-temperature endurance test. Voids 14 as shown in FIGS. 10 and 11 were formed in the interface between the bonded component parts. It is inferred that an interfacial reaction was promoted when the semiconductor device was kept at a high temperature, voids were formed due to volume change resulting from the growth of a compound layer and the voids reduced the bond strength.

A semiconductor device in Comparative example 5 was fabricated by using a high-lead solder and had satisfactory properties.

A semiconductor device in a second embodiment according to the present invention fabricated by using the bonding material of the present invention will be described with reference to FIG. 15. The semiconductor device shown in FIG. 15 includes a printed wiring board 102, a surface-mounted package 101 bonded to the printed wiring board 102 with the bonding material of the present invention, a package 103 bonded to the printed wiring board 102 with the bonding material of the present invention and a through hole package 104 connected to the printed wiring board 102 with the bonding material of the present invention. Surfaces of parts, not shown, of the packages mounted on the printed wiring board 102 are Ni-plated. The bonding material of the present invention suppresses an interfacial reaction even at high temperatures. Therefore, the semiconductor device has high bond reliability.

Figure 15:
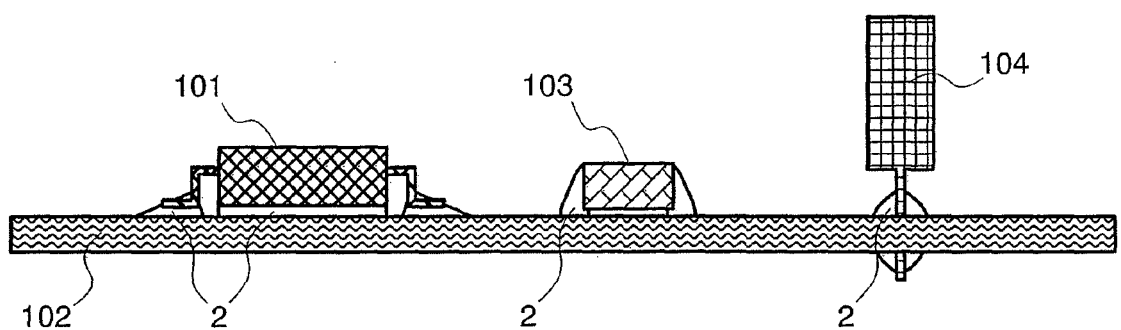
FIG. 15 is a typical view of a semiconductor device in an embodiment according to the present invention.

The semiconductor device shown in FIG. 15 is provided with the surface-mounted package 101, the package 103 and the through hole package 104. The semiconductor device may be provided with one or two of those three packages. A solder other than the bonding material of the present invention, such as a Sn-3Ag-0.5Cu solder, may be used for bonding some parts of the packages to the printed wiring board 102.

A semiconductor device in a third embodiment according to the present invention fabricated by using the bonding material of the present invention will be described with reference to FIG. 16.

Figure 16:
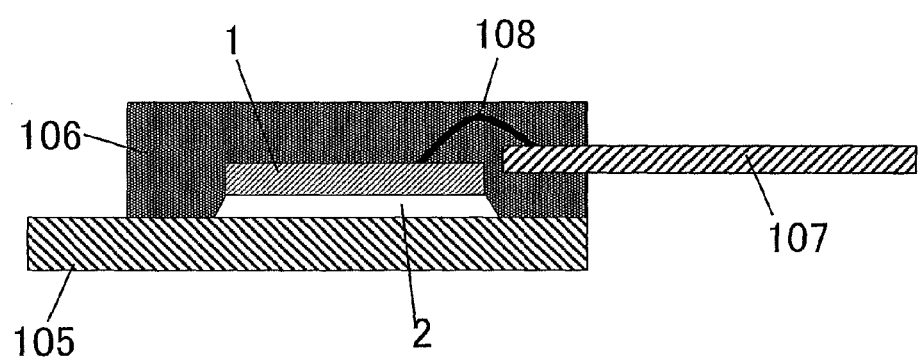

The semiconductor device shown in FIG. 16 includes a semiconductor element 1, a frame 105 bonded to the semiconductor element 1 with the bonding material of the present invention, an external lead 107 electrically connected to an electrode, not shown, of the semiconductor element 1 by a wire 108, and a molded resin package 106 covering the semiconductor element 1. Surfaces, not shown, to be bonded to other parts are Ni-plated. The bonding material of the present invention suppresses an interfacial reaction even at high temperatures and the semiconductor device has high bond reliability.

A semiconductor device in a fourth embodiment according to the present invention will be described with reference to FIG. 17.

Figure 17:
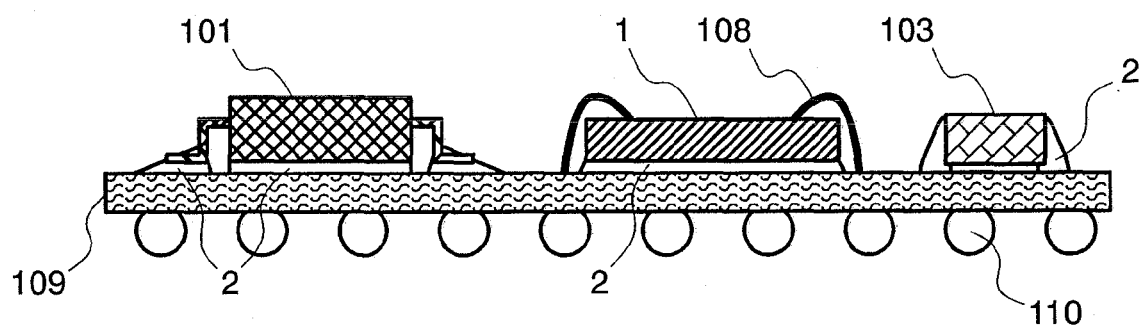
FIG. 17 is a typical view of a semiconductor device in an embodiment according to the present invention.

The semiconductor device shown in FIG. 17 has a configuration represented by that of a RF module. The semiconductor device includes a module substrate 109, a surface-mounted package 101 bonded to the module substrate with the bonding material of the present invention, a semiconductor element 1 bonded to the module substrate with the bonding material of the present invention, a package 103 bonded to the module substrate with the bonding material of the present invention, and solder balls 110 attached to the back surface of the module substrate 109. Surfaces, not shown, to be bonded to other parts are Ni-plated. The bonding material of the present invention suppresses an interfacial reaction even at high temperatures and the semiconductor device has high bond reliability.

The semiconductor device shown in FIG. 15 is provided with the surface-mounted package 101, the package 103 and the through hole package 104. The semiconductor device may be provided with one or two of those three packages. A solder other than the bonding material of the present invention, such as a Sn-3Ag-0.5Cu solder, may be used for bonding some parts of the packages to the printed wiring board 102.

The present invention is not limited to the foregoing embodiments. For example, the present invention may be applied to die bonding in forming front end modules, such as power transistors, power ICs, IGBT substrates and RF modules, and automotive power modules. The bonding material of the present invention may be used in any modes including a process of leveling a printed wiring board, a process of coating parts by dipping and printing and may be used in any articles including foils and wires, provided that the bonding material has a composition having a $Cu_6Sn_5$ content greater than a eutectic content.

The present invention provides a semiconductor device that imparts a low load to the environment and capable of withstanding high temperatures not lower than 200° C.

Although the invention has been described in its preferred embodiments with a certain degree of particularity, obviously many changes and variations are possible therein. It is therefore to be understood that the present invention may be practiced otherwise than as specifically described herein without departing from the scope and spirit thereof.

What is claimed is:

1. A semiconductor device comprising:
a semiconductor element;
a support member having a Ni-plated connecting part; and
bonding material bonding the Ni-plated connecting part of the support member to the semiconductor element,
wherein the bonding material is a Sn—Cu two-element bonding material forming a Sn-solder having a Cu content of 5 to 7% by mass and containing $Cu_6Sn_5$ grains, and
wherein the $Cu_6Sn_5$ grains form a barrier layer between the Sn-solder and the Ni-plated connecting part at the interface between the support member and bonding material.

2. A semiconductor device according to claim 1, wherein all of the Ni-plated connecting part in contact with the bonding material is covered by the barrier layer.

3. A semiconductor device according to claim 1, wherein the support member is made of Cu.

4. A semiconductor device according to claim 1, wherein the support member comprises a lead electrode.

5. A semiconductor device according to claim 1, wherein the support member comprises a substrate and a buffer member, the buffer member having the Ni-plated connecting part is connected to the semiconductor element by a first bonding layer of the bonding material, and the substrate being connected to the buffer member by a second bonding layer of the bonding material.

6. A semiconductor device according to claim 5, wherein the buffer member is arranged to absorb stress induced in the bonding material due to differences in coefficient of thermal expansion between the semiconductor element and the substrate.

* * * * *